United States Patent

Zametzer et al.

[11] Patent Number: 5,159,289
[45] Date of Patent: Oct. 27, 1992

[54] LOW-NOISE, HIGH-FREQUENCY BROADBAND AMPLIFIER

[75] Inventors: Klaus Zametzer, Forchheim; Markus Vester, Erlangen, both of Fed. Rep. of Germany

[73] Assignee: Siemens Aktiengesellschaft, Munich, Fed. Rep. of Germany

[21] Appl. No.: 737,486

[22] Filed: Jul. 30, 1991

[30] Foreign Application Priority Data

Jul. 30, 1990 [DE] Fed. Rep. of Germany ....... 4024166

[51] Int. Cl.$^5$ .............................................. H03F 1/42
[52] U.S. Cl. .................................. 330/294; 330/295; 330/306
[58] Field of Search ............... 330/107, 294, 295, 306; 324/322

[56] References Cited

U.S. PATENT DOCUMENTS

| | | | |
|---|---|---|---|
| 4,103,245 | 7/1978 | Yokoyama | 330/295 X |
| 4,524,327 | 6/1985 | Masuda et al. | 330/294 X |
| 4,920,317 | 4/1990 | Lescourret | 324/322 X |

FOREIGN PATENT DOCUMENTS

| | | |
|---|---|---|
| 2227117 | 1/1973 | Fed. Rep. of Germany . |
| 49755 | 4/1977 | Japan ................................. 330/107 |

Primary Examiner—James B. Mullins
Attorney, Agent, or Firm—Hill, Van Santen, Steadman & Simpson

[57] ABSTRACT

An input stage for a low-noise broadband amplifier includes a negative feedback capacitor connected between an input and an output of at least one amplifier element. The output of the amplifier element is terminated with a capacitor. The input stage has a real, constant input impedance in a broad range.

2 Claims, 1 Drawing Sheet

LOW-NOISE, HIGH-FREQUENCY BROADBAND AMPLIFIER

BACKGROUND OF THE INVENTION

1. Field of the Invention

The present invention relates to an input stage for a low-noise high-frequency broadband amplifier having an amplifier element.

2. Description of the Prior Art

In processing small signals, special attention must be paid to noise in the circuitry. Noise sources include, for example, ohmic resistors, electron tubes and transistors. As noise power increases with increasing bandwidths, it is often advantageous to use narrow-band amplifiers to amplify small signals. When a number of signals of varying frequency are provided at the input stage of the amplifier, a number of narrow-band pre-amplifiers must be arranged at the input stage, dependent on the bandwidths and center frequencies of the signals. The pre-amplifiers must be capable of switching, by means of coaxial switches, to attain the desired frequency.

Further, in processing high-frequency signals, the individual stages must be matched to the characteristic impedance in order to avoid reflective losses.

SUMMARY OF THE INVENTION

It is an object of the present invention to replace the various narrow-band pre-amplifiers, required to reduce noise when processing small signals, with a low-noise broadband amplifier that has a real, constant input impedance within a broad range.

The above object is inventively achieved in an input stage having a negative feedback capacitor connected between an input and an output of at least one amplifier element, and a capacitor terminating said output of said amplifier element. The capacitative negative feedback and the capacitative load resistor provide a constant, real input impedance in a broad frequency range.

Since reactances do not produce noise in the circuitry, the capacitative negative feedback also does not produce any deterioration of the noise ratio of the amplifier stage.

In one advantageous embodiment of the input stage of the present invention, the amplifier element includes two bipolar transistors, each bipolar transistor having emitter, base and collector terminals respectively connected in parallel. Such an embodiment is advantageous in that the two transistors in a parallel circuit halve the noise-optimum source impedance from approximately 100 Ohm to approximately 50 Ohm.

In another advantageous embodiment, the input stage of the present invention can be used in a nuclear magnetic resonance system. Since the components of a nuclear magnetic resonance system can be dimensioned such that the input impedance of the amplifier is real and constant in the broad frequency range from 10 MHz through 100 MHz, the input stage of the present invention would be particularly suitable in such a device. Further, it is advantageous to use the input stage of the present invention in nuclear magnetic resonance systems due to the frequency-dependence of the gain. The frequency response of such systems decreases by 6 dB per octave toward higher frequencies. In nuclear magnetic resonance systems, the amplitude and frequency of the reception signals rise with increasing fundamental field strength, often requiring an overdrive in the amplifier stage. The frequency-dependent decrease in gain provided by the present invention eliminates the need for such overdrives.

In yet another advantageous embodiment, the input stage of the present invention can also be used as a real, low-noise high-frequency terminating impedance, since the noise temperature of the terminating impedance realized by the input stage of the present invention is lower than the noise temperature of a corresponding ohmic resistor. Such terminating impedances are used, for example, in circular nuclear magnetic resonance reception systems.

An exemplary embodiment of the invention shall be set forth below with reference to three figures.

DETAILED DESCRIPTION OF THE PREFERRED EMBODIMENTS

Figure 1:
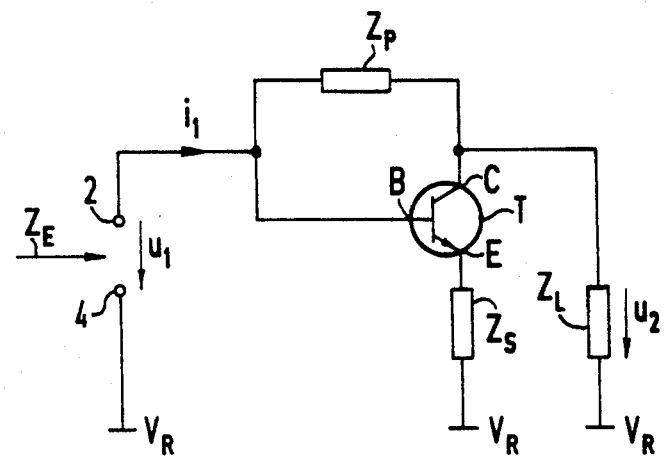
FIG. 1 is a schematic circuit diagram of a negative feedback circuit.

FIG. 1 illustrates a negative feedback circuit from which the behavior of the input stage of the present invention can be understood. An ideal transistor is represented as amplifier element T. The amplifier element T is considered ideal in that the input impedance between the base terminal B and the emitter E is assumed to be infinitely great, where the amplifier element T should behave at its collector terminal C and emitter terminal E as an ideal source. The current of the ideal current source is controlled by the voltage at the base terminal B and the emitter terminal E. It is further assumed that only infinitely small voltages between the base terminal B and the emitter terminal E are required for controlling the current, and, thus, the steepness of the ideal transistor, represented by the amplifier element T, approaches infinity. The real steepness of the amplifier element T is taken into consideration by the impedance $Z_S$. The impedance $Z_S$ is disposed between the emitter terminal E and the reference potential $V_R$. Further, the impedance $Z_S$ is the reciprocal of the steepness S.

Referring to the input posts 2, 4 of the input stage, the input post Z is connected to the base terminal B and the post 4 is connected to the reference potential $V_R$. A negative feedback impedance $Z_P$ is disposed in the negative feedback loop of the amplifier element T, between the base terminal B and the collector terminal C. A load impedance $Z_L$ is connected between the collector terminal C and the reference potential $V_R$. The input impedance $Z_E$ at the input posts 2, 4 is defined by $$Z_E = \frac{(Z_P + Z_L) Z_S}{Z_L + Z_S}.$$

Further, assuming that the negative feedback impedance $Z_P$ to be much greater than the load impedance $Z_L$, and the load impedance $Z_L$ to be much greater than the impedance $Z_S$, the impedance $Z_E$ is defined by $$Z_E \approx \frac{Z_P Z_S}{Z_L}$$

When the resistance of both the negative feedback impedance $Z_P$ and the load impedance $Z_L$ is imaginary (purely reactive), the input impedance $Z_E$ becomes real, as long as the impedance $Z_S$ defined by the steepness is also real. The input impedance $Z_E$ can be assumed to be real for a real high-frequency transistor in a broad frequency range of approximately 10 through 100 MHz.

Additionally, the gain V of the negative feedback circuit of FIG. 1 is defined as the ratio of the voltage $u_2$ at the load impedance $Z_L$ to the voltage $u_1$ at the input posts 2, 4. The gain V can also be defined by the impedances as follows:

$$V = 1 - \frac{(Z_L + Z_S) Z_P}{Z_S (Z_P + Z_L)}$$

Again assuming the negative feedback impedance $Z_P$ to be much greater than the load impedance $Z_L$, and the load impedance $Z_L$ to be much greater than the impedance $Z_S$, the gain V is defined by $$V \approx 1 - \frac{Z_L}{Z_S}.$$

Thus, the gain V decreased with increasing frequency when the load impedance $Z_2$ is capacitative, and the steepness is real.

Thus, given a capacitative negative feedback and capacitative load, a real input impedance $Z_E$ is produced where the gain V decreases with increasing frequency.

Figure 2:
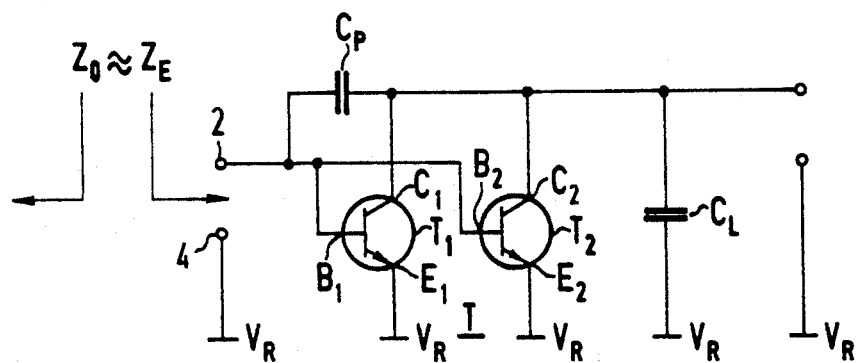
FIG. 2 is a schematic circuit diagram of an input stage constructed in accordance with the principles of the present invention.

Referring to FIG. 2, two bipolar transistors $T_1$ and $T_2$ form an amplifier element. The transistors $T_1$ and $T_2$ are respectively connected in parallel at the base terminals $B_1$, $B_2$, $C_2$, $E_2$. A negative feedback capacitor CP is connected in series between the base terminals $B_1$, $B_2$ and collector terminals $C_1$, $C_2$. A load capacitor $C_L$ is connected in parallel to the transistors $T_1$ and $T_2$. Since the load capacitor $C_L$ is usually determined by the input capacitance of the following amplifier stage, the value of capacitance of the negative feedback capacitor $C_P$ and the steepness $Z_S$ of the transistors $T_1$ and $T_2$ are selected such that the input impedance $Z_E$ is matched to the output impedance $Z_O$ of the preceding stage to avoid reflection loss. The matched impedance can be, for example, 50 Ohms.

However, the circuit of FIG. 2, in accordance with the principles of the present invention, does not provide a matching of the input impedance $Z_E$ to the output impedance $Z_O$ of the preceding stage, but rather halves the noise-optimum source impedance from approximately 100 Ohm to approximately 50 Ohm.

Figure 3:
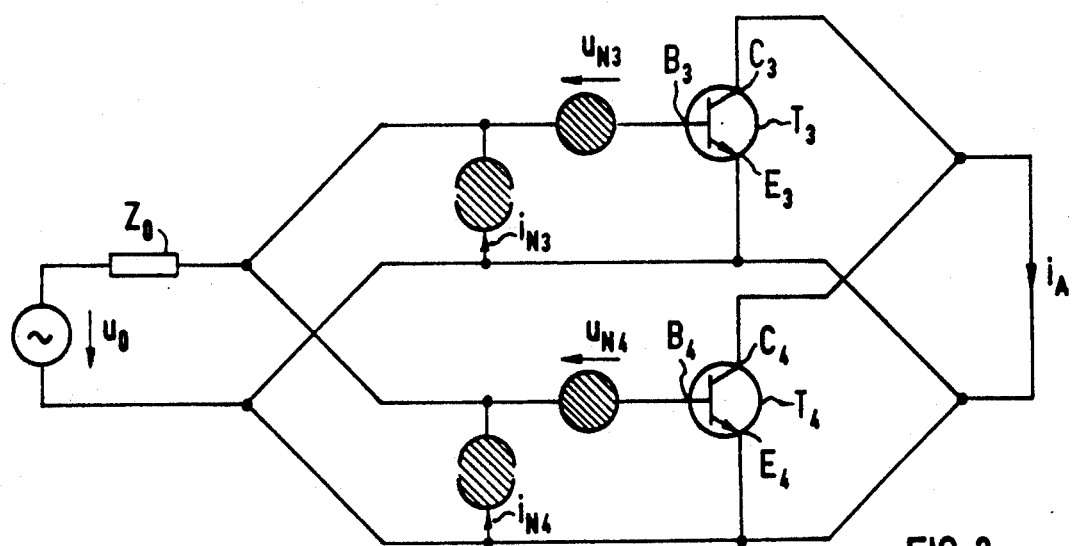
FIG. 3 is a circuit diagram of a noise equivalent circuit of the input stage of the present invention having two transistors connected in parallel.

Referring to FIG. 3, real transistors represent noise sources that are viewed as ideal, noise-free transistors in the equivalent circuit, in front of whose base terminals $B_3$, $B_4$ noise voltage sources $U_{N3}$, $U_{N4}$ are disposed. Noise current sources $i_{N3}$, $i_{N4}$ connect the base circuit to the emitter circuit.

The influence of the parallel circuit and the two transistors $T_3$ and $T_4$ on the noise behavior is described with reference to FIG. 3.

The signal-to-noise ratio for an individual transistor, for example transistor $T_3$, is greatest when the source impedance is selected at $$Z_O = \frac{u_N}{i_N} = Z_{O\,opt}.$$

where the value of the source impedance $Z_O$ is defined here as the noise-optimum source impedance $Z_{O\,opt}$, defined by the noise source $u_N$ and the noise current source $i_N$, is approximately 100 Ohms. An analysis of the signal-to-noise ratio for the parallel circuit of FIG. 3 produces the result $$(i_{AS})^2 = (2Su_O)^2 = 4S^2\, 4P_O Z_O.$$

for the signal part $i_{AS}$ in the output current $i_A$, where S is the steepness of transistor $T_3$ or $T_4$, $u_O$ is the voltage, and $P_O$ is the power of the signal source.

When all noise sources $u_N$ and $i_N$ are negligible correlated, the noise parts $i_{AN}$ in the output current $i_A$ is defined by $$(i_{AN})^2 = S^1 (2u_N^2 + 8Z_O^2\, i_N^2).$$

The signal-to-noise ratio thus becomes $$\frac{(i_{AS})^2}{i_{AN}} = \frac{2 P_O}{u_N\, i_N} \cdot \frac{2}{\frac{u_N}{2i_N Z_O} + \frac{2i_N Z_O}{u_N}},$$

and the maximum signal-to-noise ratio occurs given a noise-optimum source impedance of $$Z_{O\,opt} = \frac{1}{2} \cdot \frac{u_N}{i_N},$$

Thus, given the parallel circuit of two transistors $T_3$ and $T_4$, the noise-optimum source impedance $Z_{O\,opt}$ drops to approximately 50 Ohms, which corresponds to the characteristic impedance of the preceding transmission elements.

Although the present invention has been described with reference to a specific embodiment, those of skill in the art will recognize that changes may be made thereto without departing from the scope and spirit of the invention as set forth in the appended claims.

We claim:

1. An input stage having an input impedance for a low-noise broadband amplifier comprising:
   at least one amplifier element having an input, output and a first impedance and having a real steepness which is a reciprocal of said first impedance;
   a negative feedback capacitor connecting said input to said output;
   a capacitor having a second impedance and terminating said output of said amplifier element; and
   said second impedance being substantially larger than said first impedance for making said input impedance of said broadband amplifier real within a broad range.

2. An input stage according to claim 1, said amplifier element further comprising:
   a first bipolar transistor having a base terminal, emitter terminal, and collector terminal; and
   a second bipolar transistor having a base terminal, emitter terminal, and collector terminal respectively connected in parallel to said base terminal, emitter terminal, and collector terminal of said first bipolar transistor.

* * * * *